United States Patent [19]
Moriyama

[11] Patent Number: 5,742,243
[45] Date of Patent: Apr. 21, 1998

[54] METHOD AND APPARATUS FOR REDUCING DC COMPONENT OF RLL CODES

[75] Inventor: Yoshiaki Moriyama, Tsurugashima, Japan

[73] Assignee: Pioneer Electric Corporation, Tokyo, Japan

[21] Appl. No.: 599,963

[22] Filed: Feb. 14, 1996

[30] Foreign Application Priority Data

Feb. 20, 1995 [JP] Japan .................................. 7-030691

[51] Int. Cl.$^6$ .................................................. H03M 7/00
[52] U.S. Cl. .................................................. 341/59; 341/58
[58] Field of Search .................................. 341/59, 58, 67, 341/68, 69

[56] References Cited

U.S. PATENT DOCUMENTS

| | | | |
|---|---|---|---|
| 4,675,650 | 6/1987 | Coppersmith et al. | 340/347 DD |
| 4,760,378 | 7/1988 | Iketani et al. | 340/347 DD |
| 4,779,072 | 10/1988 | Van Gestel | 341/59 |
| 5,451,943 | 9/1995 | Satomura | 341/58 |

*Primary Examiner*—Fritz Fleming
*Assistant Examiner*—Jason L. W. Kost
*Attorney, Agent, or Firm*—Morgan, Lewis & Bockius LLP

[57] ABSTRACT

Data converting method and apparatus for forming an RLL code which can perform a control to eliminate a DC component without an increase in number of bits. Natural numbers m, n, d, k, and k, satisfy conditions such that m<n and d<k<$k_1$, an input data sequence by binary codes is divided into blocks each consisting of m bits and is sequentially converted to code words every one or a plurality of blocks at a ratio of (m bits:n bits) by a predetermined conversion rule in a manner that after completion of the conversion, the number of bits "0" between neighboring bits "1" is equal to d in minimum and k in maximum. When a value in a predetermined bit pattern in the code word sequence according to the predetermined conversion rule is equal to "1" and the value is changed to "0", a predetermined bit which causes a bit pattern that is not generated by the predetermined conversion rule is used as a control bit, and a value of the control bit is selectively set to "0" or "1", so that a new code word sequence in which the number of bits "10" between the adjacent bits "1" is equal to d in minimum and $k_1$ in maximum and the control of DC component is enabled is formed.

6 Claims, 8 Drawing Sheets

I

BIT PATTERNS OF CODE WORDS OF (1,7) RLL CODE (1)  010·000·1̲01
(2)  100·000·1̲01
(3)  010·000·100·1̲0Y
(4)  010·000·100·010
(5)  100·000·100·1̲0Y
(6)  X01·000·000·1̲01
(7)  100·000·100·010
(8)  X01·000·000·100·1̲0Y
(9)  010·000·100·000·001
(10) X01·000·000·100·010
(11) 100·000·100·000·001
(12) 010·000·100·000·1̲0Y
...

II

BIT PATTERNS OF CODE WORDS INCLUDING "0·000·00"

BIT PATTERNS OF CODE WORDS OF (1,7) RLL CODE

| | I | II | |
|---|---|---|---|
| | | BIT PATTERNS OF CODE WORDS INCLUDING "0·000·00" | |
| (1) | 010·100·001 | 010·000·001 | ($k_1=7$) |
| (2) | 100·100·001 | 100·000·001 | ($k_1=7$) |
| (3) | 010·100·000·10Y | 010·000·000·10Y | ($k_1=7$) |
| (4) | 010·100·000·010 | 010·000·000·010 | ($k_1=8$) |
| (5) | 100·100·000·10Y | 100·000·000·10Y | ($k_1=8$) |
| (6) | X01·000·100·001 | X01·000·000·001 | ($k_1=9$) |
| (7) | 100·100·000·010 | 100·000·000·010 | ($k_1=9$) |
| (8) | X01·000·100·000·10Y | X01·000·000·000·10Y | ($k_1=9$) |
| (9) | 010·100·000·001 | 010·000·000·001 | ($k_1=9$) |
| (10) | X01·000·100·000·010 | X01·000·000·000·010 | ($k_1=10$) |
| (11) | 100·100·000·001 | 100·000·000·001 | ($k_1=10$) |
| (12) | 010·100·000·000·10Y | 010·000·000·000·10Y | ($k_1=10$) |
| | --- | --- | |

| | I | | II | |
|---|---|---|---|---|
| | BIT PATTERNS OF CODE WORDS OF (1,7) RLL CODE | | BIT PATTERNS OF CODE WORDS INCLUDING "000·000" | |
| (1) | Y01·000·100·10Y | | Y01·000·000·10Y | ($k_1=7$) |
| (2) | Y01·000·100·010 | | Y01·000·000·010 | ($k_1=7$) |
| (3) | 010·000·100·10Y | | 010·000·000·10Y | ($k_1=7$) |
| (4) | Y01·000·100·001 | | Y01·000·000·001 | ($k_1=8$) |
| (5) | 010·000·100·010 | | 010·000·000·010 | ($k_1=8$) |
| (6) | 100·000·100·10Y | | 100·000·000·10Y | ($k_1=9$) |
| (7) | Y01·000·100·000·10Y | | Y01·000·000·000·10Y | ($k_1=9$) |
| (8) | 010·000·100·001 | | 010·000·000·001 | ($k_1=9$) |
| (9) | 100·000·100·010 | | 100·000·000·010 | ($k_1=9$) |
| (10) | Y01·000·100·000·010 | | Y01·000·000·000·010 | ($k_1=10$) |
| (11) | 010·000·100·000·10Y | | 010·000·000·000·10Y | ($k_1=10$) |
| (12) | 100·000·100·001 | | 100·000·000·001 | ($k_1=10$) |
| | --- | | --- | |

|     | I<br>BIT PATTERNS OF CODE WORDS OF (1,7) RLL CODE | II<br>BIT PATTERNS OF CODE WORDS INCLUDING "000·000" |         |
|-----|---|---|---|
| (1)  | Y01·001·000·10Y         | Y01·000·000·10Y         | ($k_1=7$)  |
| (2)  | Y01·001·000·010         | Y01·000·000·010         | ($k_1=7$)  |
| (3)  | 010·001·000·10Y         | 010·000·000·10Y         | ($k_1=7$)  |
| (4)  | Y01·001·000·001         | Y01·000·000·001         | ($k_1=8$)  |
| (5)  | 010·001·000·010         | 010·000·000·010         | ($k_1=8$)  |
| (6)  | 100·001·000·10Y         | 100·000·000·10Y         | ($k_1=8$)  |
| (7)  | Y01·001·000·000·10Y     | Y01·000·000·000·10Y     | ($k_1=9$)  |
| (8)  | 010·001·000·001         | 010·000·000·001         | ($k_1=9$)  |
| (9)  | 100·001·000·010         | 100·000·000·010         | ($k_1=9$)  |
| (10) | Y01·001·000·000·010     | Y01·000·000·000·010     | ($k_1=10$) |
| (11) | 010·001·000·000·10Y     | 010·000·000·000·10Y     | ($k_1=10$) |
| (12) | 100·001·000·001         | 100·000·000·001         | ($k_1=10$) |
|      | ---                     | ---                     |            |

FIG. 4

| DATA (1 BLOCK) | CODE WORD |
|---|---|
| 01 | X00 |
| 10 | 010 |
| 11 | X01 |

FIG. 7A

| DATA (2 BLOCKS) | CODE WORD |
|---|---|
| 0001 | X00001 |
| 0010 | X00000 |
| 0011 | 010001 |
| 0000 | 010000 |

FIG. 7B

| DATA (1 BLOCK) | CODE WORD |
|---|---|
| 00 | 010 |
| 01 | 001 |
| 10 | 100 |
| 11 | 101 |

*FIG. 8A*

| DATA (2 BLOCKS) | CODE WORD |
|---|---|
| 01 • 10 | 010 • 000 |
| 01 • 11 | 001 • 000 |
| 11 • 10 | 100 • 000 |
| 11 • 11 | 101 • 000 |

*FIG. 8B*

METHOD AND APPARATUS FOR REDUCING DC COMPONENT OF RLL CODES

BACKGROUND OF THE INVENTION

1. Field of the Invention

The present invention relates to a method of data conversion used when recording data on a recording medium at a high density or when data is transmitted by a transmitting system which has a limited bandwidth, and to an apparatus of data conversion.

2. Description of Background Information

In order to record a data sequence of binary codes on a recording medium at a high density or to transmit the data sequence to a transmitting system, in general a data converting system is used in which the data sequence is divided into blocks each consisting of m bits and is sequentially converted into code words, every one individually or a plurality of blocks, by setting the number of bits per block to n bits in a manner such that after completion of a conversion, the number of bit values "0" between neighboring bit values "1" is equal to d at a minimum and k at a maximum. A set of code words which are generated by the data converting system is called an RLL (Run Length Limited) code and many RLL code scheme have been made open until now. One of the important features which are required for the RLL code, is there requirement that no DC component is included. Among conventional RLL codes for a high density recording or for a transmission, however, there are many RLL codes which include DC components, so that countermeasures for eliminating the DC component are required. DC component eliminating countermeasures, are disclosed in Japanese Patent Kokai No.58-75353 and Japanese Patent Kokai No.4-115751. In both of the countermeasures, however, the number of bits is increased for the purpose of elimination of the DC component, resulting in a decrease in amount of information data which can be recorded on a recording medium or can be transmitted to a transmitting system under a predetermined bit rate.

It is, therefore, an object of the invention to provide a data converting method and apparatus for generating RLL codes which can perform a countermeasure eliminate a DC component without causing an increase in number of bits.

SUMMARY AND OBJECTS OF THE INVENTION

A data converting method according to the invention is characterized by m, n, d, k, and $k_1$ being natural numbers having relations such that m<n and d<k≦$k_1$, the input data sequence expressed by binary codes, is divided into blocks each consisting of m bits and is sequentially converted into code words individually or a plurality of blocks at a ratio of (m bits:n bits) by a predetermined conversion rule in a manner such that after completion of the conversion, the number of bits "0" between adjacent bits "1" is equal to d a number and k at a maximum. When a value in a predetermined bit pattern in the code word sequence, according to the predetermined conversion rule, is equal to "1" and the value is changed to "0", a predetermined bit which causes a bit pattern that is not generated by the predetermined conversion rule is used as a control bit, and a new code word sequence in which the number of bits "0" between the adjacent bits "1" is equal to d at a minimum and $k_1$ in maximum and a DC component that can be controlled is formed by selectively setting the value of the control bit to "0" or "1".

According to the data converting method of the invention, for the RLL code in which the DC component is not eliminated, it is assumed that the minimum number of bits "0" between the adjacent bits "1" is held constant with increase in the maximum number being permitted. When a predetermined bit pattern occurs in the code word sequence, a predetermined bit in the bit pattern is used as the control bit and either one of "0" and "1" is selected as a value of the control bit so as to reduce the DC component.

A data converting apparatus according to the invention comprises: includes a means for setting m, n, d, k, and $k_1$ as natural numbers interrelated such that m<n and d<k<$k_1$ and dividing an input data sequence expressed by binary codes into blocks each consisting of m bits, and sequentially converting the data blocks individually plurality of data blocks at a ratio of (m bits:n bits) by a predetermined conversion rule in a manner such that after completion of the conversion, the number of bits "0" between adjacent bits "1" is equal to d in minimum and k in maximum; and means for setting a predetermined bit, which causes a bit pattern that is not generated by the predetermined conversion rule to a control bit when a value of the bit is equal to "1" in a predetermined bit pattern in the code word sequence by the predetermined conversion rule. The value is changed to "0" and forms a new code word sequence in which the number of bits "0" between the adjacent bits "1" is equal to d at a minimum and $k_1$ at a maximum and the DC component can be controlled by selectively deciding a value of the control bit as "0" or "1".

BRIEF DESCRIPTION OF THE DRAWINGS

FIG. 1 is a diagram showing code word bit patterns I of "0·000·10" obtained by a conversion rule shown in TABLE 1A and TABLE 1B and code word bit patterns II obtained by changing values of control bits in the patterns I.

FIG. 2 is a diagram showing code word bit patterns I of "0·100·00" obtained by the conversion rule in TABLE 1A and TABLE 1B and code word bit patterns II obtained by changing values of control bits in the patterns I.

FIG. 3 is a diagram showing code word bit patterns I of "000·100" obtained by a conversion rule shown in TABLE 2A and TABLE 2B and code word bit patterns II obtained by changing values of control bits in the patterns I.

FIG. 4 is a diagram showing code word bit patterns I of "001·000" obtained by the conversion rule in TABLE 2A and TABLE 2B and code word bit patterns II obtained by changing values of control bits in the patterns I.

FIGS. 7A and 7B are tables showing the dividing of input data sequences into blocks of m-bits and the subsequent generation of n-bit codewords.

FIG. 8A and FIG. 8B depict an example of the conversion rule for forming the (1,7) RLL code from the input data sequence.

DETAILED DESCRIPTION OF THE PREFERRED EMBODIMENTS

Figure 5:
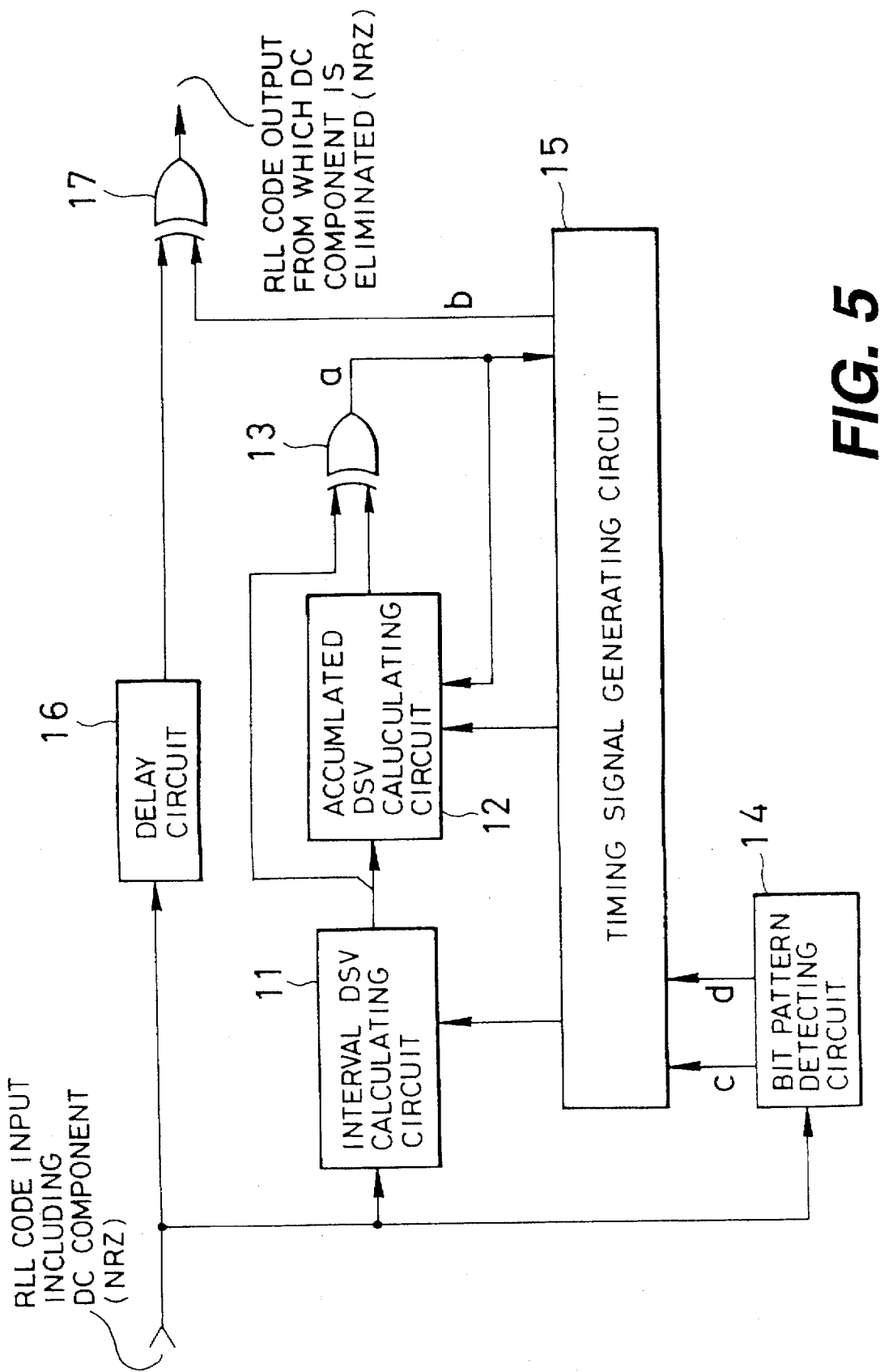
FIG. 5 is a block diagram showing a construction of a data converting apparatus according to the invention.

An embodiment in which the invention is applied to two kinds of RLL codes (hereinafter, referred to as a (1, 7) RLL code) where m=2, n=3, d=1, and k=7 will now be described in detail with reference to the following tables and the drawings.

TABLE 1A

| Data (1 block) | Code Word |
| --- | --- |
| 01 | X00 |
| 10 | 010 |
| 11 | X01 |

TABLE 1B

| Data (2 blocks) | Code Word |
| --- | --- |
| 0001 | X00001 |
| 0010 | X00000 |
| 0011 | 010001 |
| 0000 | 01000 |

Tables 1A and 1B and FIGS. 7A and 7B show an example of a data conversion rule from an input data sequence to the (1, 7) RLL code. "X" denotes a complement of a just-preceding bit after completion of the conversion. In other words, "X" denotes a complement of the neighboring bit of "X" in a just-preceding code word. The converted code word is recorded or transmitted as a waveform (NRZI waveform) in which "1" indicates an inversion and "0" indicates a non-inversion. According to the conversion rule of TABLE 1A and TABLE 1B, a bit pattern of "0·9000·900" doesn't appear after completion of the conversion. The symbol "·" denotes a position corresponding to a block boundary. A bit pattern including "0·000·00" and having the same length is, therefore, made to correspond to a predetermined bit pattern among the bit patterns derived by the conversion rule of TABLE 1A and TABLE 1B. It is permitted to select either one of the patterns, so that the RLL code which can be uniquely decoded and, in which the presence or absence of the inversion can be selected, can be set.

Figure 1:
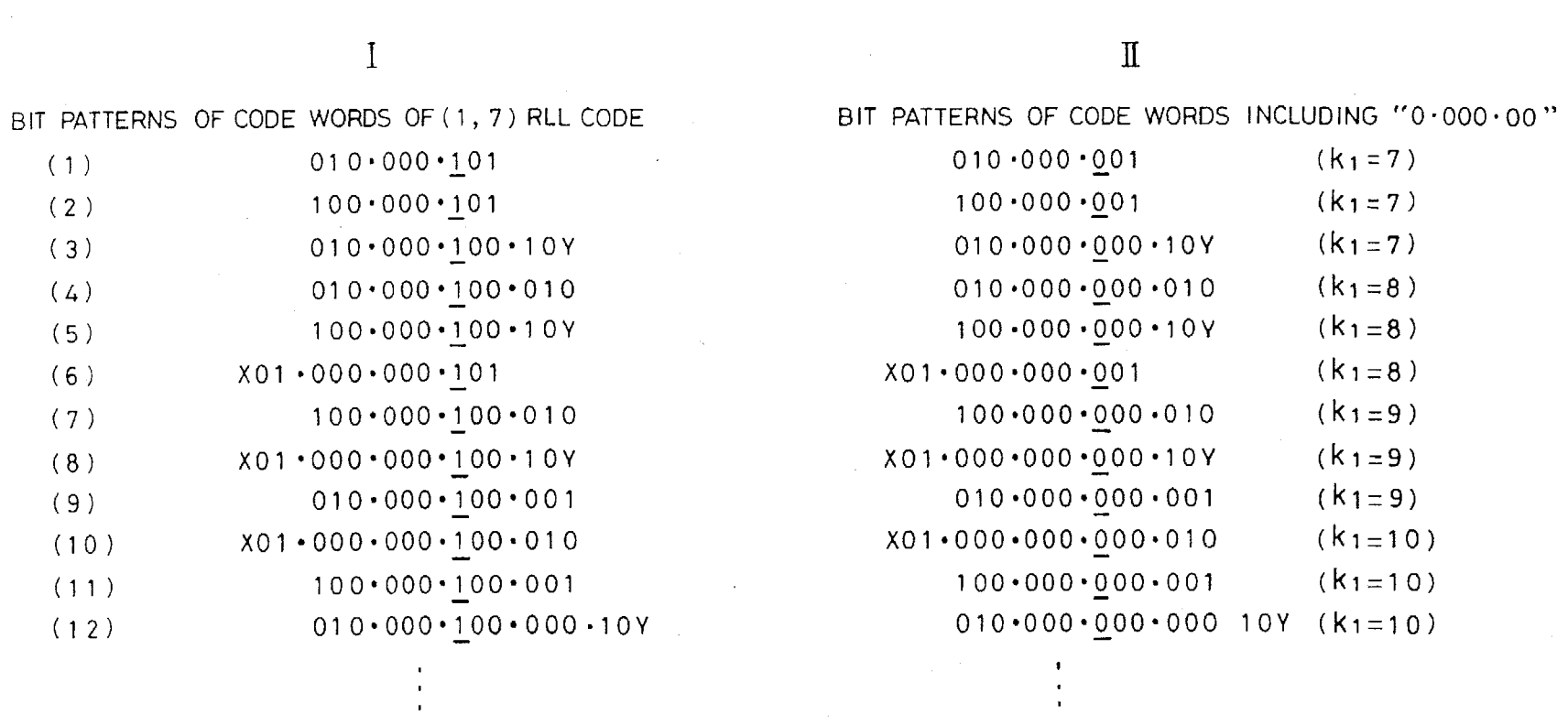

Specifically speaking, as shown in FIG. 1, the predetermined bit pattern I obtained according to TABLE 1A and TABLE 1B and the bit pattern II having the same length as that of the bit pattern I and including "0·000·00" are made to correspond in a one-to-one relationship. As shown by underlined portions, the bit at a specific position in those patterns is regarded as a control bit. When the bit pattern is converted to the code word corresponding to the pattern I or when the code word corresponding to the pattern I is generated, either one of the bit patterns I and II is selected as a new code word bit pattern, thereby controlling the inversion of the control bits.

In FIG. 1, "Y" denotes either "1" or "0" and $k_1$ indicates the maximum continuous number of bit values "0" between the neighboring bit values "1" in the RLL code when the bit pattern is used. In the correspondence relationships in FIG. 1, although the correspondence relationships until $k_1$=10 are shown, but bit patterns which correspond to each other can be also similarly obtained with respect to $k_1$ which is larger than 10. In the (1, 7) RLL code, there is an occurrence probability of each bit pattern, so that a bit pattern to be used for inversion control can be decided in accordance with required conditions or specifications.

That is, in the case of an increasing probability at which the inversion control can be performed, an upper limit of $k_1$ is raised and many bit patterns are used. In the case where the upper limit of $k_1$ is suppressed, only the bit pattern which satisfies the conditions is used, so that a probability at which the inversion control can be performed is also limited there. Since an error propagation length also differs depending on the bit pattern, the bit pattern to be used can be also determined in accordance with the conditions of the error propagation length. Although a judgment reference of the inversion control for eliminating the DC component is not limited, for example, one bit of the high level "H" and one bit of the low level "L" of the waveform are set to +1 and −1, respectively, and an accumulated addition value is set to DSV (Digital Sum Value). It is sufficient to decide a value of the control bit so as to further decrease the absolute value of the DSV at a predetermined position before the control bit.

In the example, although the position of the control bit is set at the fifth bit from the head of the bit pattern of "0·000·00", the control bit can be also set at another position. For example, as shown in FIG. 3, the position can be also set at the second bit from the head.

Explanation will now be made with respect to the case of applying the invention to the (1, 7) RLL code by another conversion rule.

TABLE 2A

| Data (1 block) | Code Word |
| --- | --- |
| 00 | 010 |
| 01 | 001 |
| 10 | 100 |
| 11 | 101 |

TABLE 2B

| Data (2 blocks) | Code Word |
| --- | --- |
| 01·10 | 010·000 |
| 01·11 | 001·000 |
| 11·10 | 100·000 |
| 11·11 | 101·000 |

Tables 2A and 2B FIGS. 8A and 8B show another example of the conversion rule for forming the (1, 7) RLL code from the input data sequence. The symbol "·" denotes a position corresponding to a boundary of blocks before the conversion. When a block to be converted and the next block correspond to the conversion of two blocks, the conversion of two blocks is performed. In the other cases, it is assumed that a block to be converted is subjected to the conversion of one block. In the case of TABLE 2A and TABLE 2B, a bit pattern of "000·000" doesn't appear after the conversion. In a manner similar to the case of TABLE 1A and 1B, as shown in FIG. 3, the bit patterns are made to correspond, thereby making it possible to perform the inversion control in the waveform sequence by the control bits with underlines.

A method of deciding a bit pattern to be used for the inversion control is similar to the case of TABLE 1. The position of the control bit can be also set at another position in a manner similar to the case of TABLE 1A and TABLE 1B. For example, the position can be also as shown in FIG. 4.

FIG. 5 shows an example of a data converting circuit realizing the above-mentioned data conversion. In the embodiment, since inserting intervals of DC control bits are not constant and its maximum interval is not limited, it is assumed in FIG. 5 that the DC control bit is certainly included in a sync signal. Even in the worst case, the inversion control in the waveform sequence for eliminating the DC component is executed at inserting intervals of the sync signal. When the predetermined bit pattern, as mentioned above also appears in the code word sequence between the sync signals, additionally, the inversion control is properly performed by the DC control bits included into the code word sequence between them. It is now assumed that the sync signals are inserted to the code word sequence of the RLL code at regular intervals and an interval from the DC control bit in a certain sync signal to the bit just before the DC control bit in the next sync signal is set to one sync interval. It is also assumed that an interval from a certain DC control bit to the bit just before the next DC control bit is set to one DC control interval.

An input signal in FIG. 5 is an RLL code including the DC component converted to the NRZ waveform and it is assumed that the sync signal has been inserted in the RLL code. An interval DSV calculating circuit 11 calculates DSV (interval DSV) for each DC control interval with respect to the input RLL code. An accumulated DSV calculating circuit 12 calculates an accumulated DSV in a range from the head bit to the present bit with respect to an output RLL code. An EX-OR gate 13 forms an inversion decision signal (a) from the positive or negative sign of each of the values of the interval DSV and the accumulated DSV. A bit pattern detecting circuit 14 detects the bit pattern including the DC control bit included in the input RLL code and the sync signal. A timing signal generating circuit 15 supplies various kinds of timing signals and control signals to the circuits. A delay circuit 16 delays the input RLL code for a period of time from an input time point of the DC control bit included in the input RLL code to a time point when an inversion control signal (b) for the DC control bit is generated from the timing signal generating circuit 15. An EX-OR gate 17 inverts an output signal of the delay circuit 16 by the inversion control signal (b) from the timing signal generating circuit 15 and generates the inverted signal as a new RLL code word sequence in which the DC component is reduced.

Figure 6:
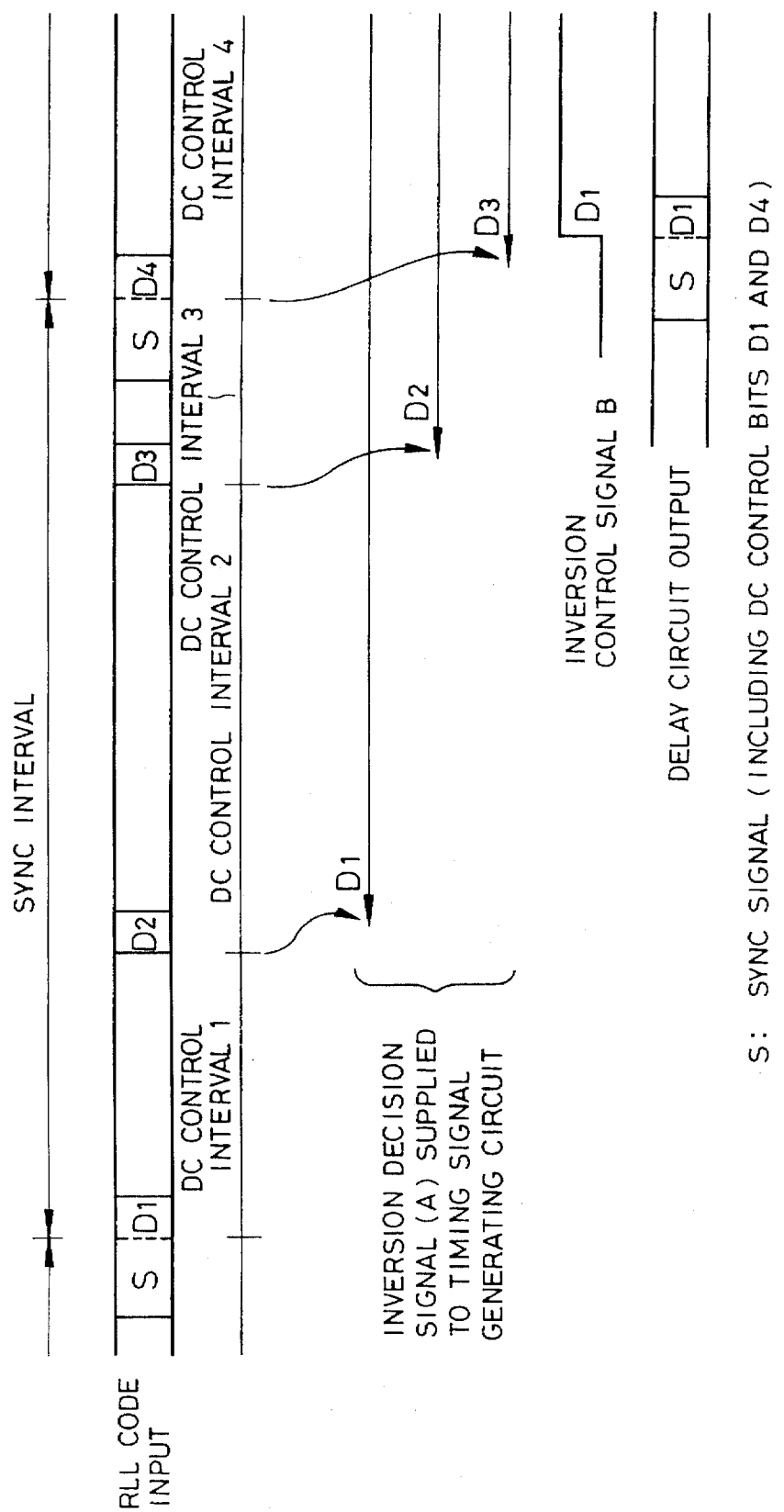
FIG. 6 is a timing chart showing the operation of the data converting apparatus of FIG. 5.

FIG. 6 is a timing chart showing an example of the operation of the data converting circuit in FIG. 5.

The timing signal generating circuit 15 synchronizes the internal operation with a synchronizing interval by a sync signal detection pulse (c) from the bit pattern detecting circuit 14. The timing signal generating circuit 15 resets the interval DSV calculating circuit 11 in response to a bit pattern detection pulse (d) and fetches an output of the EX-OR gate 13 to the inside. An output (a) of the EX-OR gate 13 at this time is the inversion decision signal (a) formed from the positive or negative sign of each of the interval DSV value before it is reset and the accumulated DSV value in accordance with the following TABLE 3 and indicates the non-inversion by "1" (high level) and denotes the inversion by "0" (low level). The fetched inversion decision signal (a) is held in the timing signal generating circuit 15 at least until the inversion control signal (b) formed by the inversion decision signal is generated. The accumulated DSV calculating circuit 12 calculates the accumulated DSV from the head bit after completion of the initial reset to the present bit with respect to the output RLL code, stores the value of the accumulated DSV, performs an addition or a subtraction between the interval DSV and the accumulated DSV in accordance with TABLE 3 at the time of the resetting of the interval DSV calculating circuit 11, and updates the accumulated DSV to be stored. The timing signal generating circuit 15 generates the inversion control signal (b) which is set to "1" for the inversion to "0" for the non-inversion in accordance with the fetched inversion decision signal (a) with a delay time obtained by adding a predetermined time to one sync interval for the input RLL code. The reason why the delay time is set one sync interval or longer is to enable the value of the DC control bit to be decided at every DC control interval by setting the end of the DC control interval to a DSV evaluating point irrespective of the number and position of the DC control bits included in each sync interval. When the timing signal generating circuit 15 generates the inversion control signal (b), the corresponding DC control bit is generated from the delay circuit 16 in accordance with the delay time as mentioned above. The generated DC control bit is inverted or non-inverted at every DC control interval by the EX-OR gate 17 and is generated.

Explanation will now be made with respect to the inversion decision and the calculation of the accumulated DSV in TABLE 3.

TABLE 3

Inversion Control Table

| Sign of Accumulated DSV | Sign of interval DSV | Inversion Decision Signal | Next Accumulated DSV |
| --- | --- | --- | --- |
| + | + | Inversion | A–B |
| – | + | Non-inversion | A+B |
| + | – | Inversion | A+B |
| – | – | Non-inversion | A–B |

A: Accumulated DSV
B: Interval DSV

In the embodiment, the DC control is performed by changing the value of only the DC control bit at the head in the DC control interval in each DC control interval. That is, whether the waveform of the whole DC control interval is inverted at every DC control interval or not is decided so as to further decrease the absolute value of the DSV. The absolute value of the DSV at every DC control interval is not changed by the inversion but only its positive or negative sign is changed. By performing the inversion in case of the same sign as that of the accumulated DSV and by not performing the inversion in case of the different sign, the selection is performed so as to further reduce the absolute value of the accumulated DSV at the end of the DC control interval. In the accumulated DSV, the value is updated by accumulating and adding the DSV values at every DC control interval for the output RLL code. With respect to the DSV value in the DC control interval inverted in the output RLL code, however, the positive or negative sign is opposite to that of the interval DSV value obtained by the interval DSV calculating circuit 11. The arithmetic operation at the time of the updating is, therefore, set to "accumulated DSV (A)—interval DSV (B)" when the DC control interval is inverted and is set to "accumulated DSV (A)+interval DSV (B)" in case of the non-inversion.

In the DC eliminating method disclosed in Japanese Patent Kokai No.4-115751, the inversion control is certainly performed at certain regular intervals. Conversely in the DC eliminating method according to the invention, the inversion control occurs in the code word sequence at a certain probability. In many cases however, it is enough by the DC eliminating method according to the invention, so that the invention is considered to be useful.

Although the conversion rule shown in tables 1A and 1B or the conversion rule shown in tables 2A and 2B has been used in the embodiments, another conversion rule having a spirit similar to that mentioned above can be also used. In the embodiments, although m, n, d, and k are 2, 3, 1, and 7, the invention can be applied even when they are other values.

According to the invention as mentioned above, in the code word sequence of the RLL code including the DC component, when a predetermined bit pattern is generated, a predetermined bit in the pattern is used as the control bit, "0" or "1" is selected as a value of the control bit so as to further reduce the DC component in the waveform sequence, so that the RLL code in which the DC component is eliminated can be obtained without increasing the number of bits. Since the bit which causes a bit pattern that is not generated by the conversion rule of the RLL code including the DC component when the original value is equal to "1" and the value is changed to "0" is used as the control bit, when the value of the control bit is set to "0", the same pattern as that of the other code word doesn't appear and the RLL code can be unconditionally decoded.

FIGS. 7A and 7B are tables showing the dividing of input data sequences into blocks of m-bits and the subsequent generation of n-bit codewords.

FIGS. 8A and 8B are tables showing an example of a data conversion rule from an input data sequence to the (1.7) RLL code.

What is claimed is:

1. A data converting method comprising the steps of:

dividing an input data sequence expressed by binary codes into blocks each consisting of m bits when assuming that m, n, d, k, and $k_1$ are natural numbers having a relationship such that m<n and d<k≦$k_1$ and sequentially converting into code words, consisting of a plurality of bits whose number is an integer multiple of n including n, every one or a plurality of said blocks at a ratio of (m-bits:n-bits) by a predetermined conversion rule in a manner such that after completion of a conversion, the number of bits "0" between the neighboring bits "1" is equal to d at a minimum and k at a maximum; and setting a predetermined bit in a predetermined bit pattern which appears in said code word sequence according to said predetermined conversion rule as a control bit, said predetermined bit causing a bit pattern that is not generated by said predetermined conversion rule when its value is changed from "1" to "0", and forming a new code word sequence in which the number of bits "0" between the neighboring bits "1" is equal to d at a minimum and $k_1$ at a maximum and a DC component can be controlled by selectively setting the value of said control bit to "0" or "1".

2. A method according to claim 1, wherein a bit pattern of "0·000·000" occurs when said m, n, d, and k are 2, 3, 1, and 7, and four kinds of data expressed by two bits of each block are first to fourth data, said data is sequentially converted to code words by a conversion rule in the following table, and said control bit is selectively set to "0" after completion of a conversion represented by:

| Data (1 block) | Code Word |
| --- | --- |
| First Data | X00 |
| Second Data | 010 |
| Third Data | X01 |

| Data (2 blocks) | Code Word |
| --- | --- |
| Fourth Data · a-th Data | X00·001 |
| Fourth Data · b-th Data | X00·000 |
| Fourth Data · c-th Data | 010·001 |
| Fourth Data · d-th Data | 010·000 | where "·" is position corresponding to a boundary of blocks before the conversion, "X" is a complement of a just-before bit in the code word after completion of the conversion, and "a, b, c, d" are any one of integers of 1 to 4 being allocated.

3. A method according to claim 1, wherein a bit pattern of "000·000" occurs when said m, n, d, and k are 2, 3, 1, and 7, respectively, and four kinds of data expressed by two bits of each block in said input data sequence are first to fourth data and are sequentially converted into code words by a conversion rule in the following table, and said control bit is selectively set to "0" after completion of a conversion represented by:

| Data (1 block) | Code Word |
| --- | --- |
| First Data | 010 |
| Second Data | 001 |
| Third Data | 100 |
| Fourth Data | 101 |

| Data (2 blocks) | Code Word |
| --- | --- |
| Second Data · Third Data | 010·000 |
| Second Data · Fourth Data | 001·000 |
| Fourth Data · Third Data | 100·000 |
| Fourth Data · Fourth Data | 101·000 | where "·" is position corresponding to a boundary of blocks before the conversion, when the block to be converted and the next block correspond to a conversion of two blocks, the conversion of two blocks is performed and in other cases, the block to be converted is subjected to a conversion of one block.

4. A data converting apparatus comprising:

means for dividing an input data sequence expressed by binary codes into blocks each consisting of m bits when m, n, d, k, and $k_1$ are natural numbers having a relationship such that m<n and d<k<$k_1$ and sequentially converting into code words, consisting of a plurality of bits whose number is an integer multiple of n including n every one or a plurality of said blocks at a ratio of (m-bits n-bits) by a predetermined conversion rule in a manner such that after completion of a conversion, the number of bits "0" between the neighboring bits "1" is equal to d at a minimum and k at a maximum; and means for setting a predetermined bit in a predetermined bit pattern which appears in said code word sequence according to said predetermined conversion rule as a control bit, said predetermined bit causing a bit pattern that is not generated by said predetermined conversion rule when its value is changed from "1" to "0", and forming a new code word sequence in which the number of bits "0" between the neighboring bits "1" is equal to d at a minimum and $k_1$ at a maximum and a DC component can be controlled by selectively setting the value of said control bit to "0" or "1".

5. An apparatus according to claim 4, wherein a bit pattern of "0·000·00" occurs when said m, n, d, and k are 2, 3, 1, and 7, and four kinds of data expressed by two bits of each block are first to fourth data and are sequentially converted to code words by a conversion rule in the following table, and said control bit is selectively set to "0" after completion of a conversion represented by:

| Data (1 block) | Code Word |
| --- | --- |
| First Data | X00 |
| Second Data | 010 |
| Third Data | X01 |

| Data (2 blocks) | Code Word |
| --- | --- |
| Fourth Data • a-th Data | X00•001 |
| Fourth Data • b-th Data | X00•000 |
| Fourth Data • c-th Data | 010•001 |
| Fourth Data • d-th Data | 010•000 | where "•" is position corresponding to a boundary of blocks before the conversion, "X" is a complement of a just-before bit in the code word after completion of the conversion, and "a, b, c, d" are any one of integers of 1 to 4 being allocated.

6. An apparatus according to claim 4, wherein a bit pattern of "000•000" occurs when said m, n, d, and k are 2, 3, 1, and 7, respectively, and four kinds of data expressed by two bits of each block in said input data sequence are first to fourth data and are sequentially converted into code words by a conversion rule in the following table, and said control bit is selectively set to "0" after completion of a conversion represented by:

| Data (1 block) | Code Word |
| --- | --- |
| First Data | 010 |
| Second Data | 000 |
| Third Data | 100 |
| Fourth Data | 100 |

| Data (2 blocks) | Code Word |
| --- | --- |
| Second Data • Third Data | 010•001 |
| Second Data • Fourth Data | 001•000 |
| Fourth Data • Third Data | 100•001 |
| Fourth Data • Fourth Data | 101•000 | where "•" is position corresponding to a boundary of blocks before the conversion, when the block to be converted and the next block correspond to a conversion of two blocks, the conversion of two blocks is performed and in other cases, the block to be converted is subjected to a conversion of one block.

\* \* \* \* \*